United States Patent
Mayer et al.

(10) Patent No.: US 7,089,468 B2
(45) Date of Patent: Aug. 8, 2006

(54) PROGRAM-CONTROLLED UNIT AND METHOD FOR IDENTIFYING AND/OR ANALYZING ERRORS IN PROGRAM-CONTROLLED UNITS

(75) Inventors: Albrecht Mayer, Deisenhofen (DE); Stefan Pfab, Pullach (DE); Martin Kaibel, München (DE)

(73) Assignee: Infineon Technologies AG, Munich (DE)

( * ) Notice: Subject to any disclaimer, the term of this patent is extended or adjusted under 35 U.S.C. 154(b) by 385 days.

(21) Appl. No.: 10/085,919

(22) Filed: Feb. 28, 2002

(65) Prior Publication Data
US 2002/0144201 A1 Oct. 3, 2002

Related U.S. Application Data

(63) Continuation of application No. PCT/DE00/02956, filed on Aug. 28, 2000.

(30) Foreign Application Priority Data
Aug. 30, 1999 (DE) ................. 199 41 099

(51) Int. Cl.
*G01R 31/28* (2006.01)
*G06F 11/00* (2006.01)

(52) U.S. Cl. ........................... 714/726; 714/736

(58) Field of Classification Search ........ 714/724–727, 714/729, 733, 735–736, 25, 30, 33, 39, 48, 714/57
See application file for complete search history.

(56) References Cited

U.S. PATENT DOCUMENTS

| | | | | |
|---|---|---|---|---|
| 4,503,537 A | * | 3/1985 | McAnney | 714/728 |
| 5,253,359 A | * | 10/1993 | Spix et al. | 714/46 |
| 5,453,992 A | * | 9/1995 | Whetsel | 714/730 |
| 5,642,363 A | * | 6/1997 | Smith | 714/729 |
| 5,777,489 A | * | 7/1998 | Barbier et al. | 326/40 |
| 5,920,575 A | | 7/1999 | Gregor et al. | |
| 6,006,347 A | * | 12/1999 | Churchill et al. | 714/724 |
| 6,094,729 A | * | 7/2000 | Mann | 714/25 |
| 2003/0097614 A1 | * | 5/2003 | Rajski et al. | 714/30 |

FOREIGN PATENT DOCUMENTS

| | | | |
|---|---|---|---|
| EP | 0 926 598 A1 | | 6/1999 |
| JP | 63081552 A | * | 4/1988 |

OTHER PUBLICATIONS

S. Narayanan et al., "Reconfigurable scan chains: A novel approach to reduce test application time", Proceedings of ICCAD, p. 710-715, Sep. 1993.*

(Continued)

*Primary Examiner*—Albert Decady
*Assistant Examiner*—Cynthia Britt
(74) *Attorney, Agent, or Firm*—Laurence A. Greenberg; Werner H. Stemer; Ralph E. Locher

(57) ABSTRACT

The program-controlled unit, during the execution of the program, can switch itself to a state in which selected elements that can be connected to form scan chains or all of the elements can no longer change their state, according to a predetermined result. If these elements are then connected to form a scan chain and read out, the data obtained as a result can be used to identify and/or analyze any errors existing in the program-controlled unit rapidly and reliably.

14 Claims, 2 Drawing Sheets

OTHER PUBLICATIONS

Narayanan, S. and Breuer, M.A.; Reconfiguration techniques for a single scan chain; IEEE Transactions on Computer-Aided Design of Integrated Circuits and Systems, vol.: 14 Issue: 6, Jun. 1995, pp. 750-765.*

IBM Technical Disclosure Bulletin (TDB-ACC-NO) NA9003105 "Programmable Microcoded Self-Test Apparatus for Processor Cache Memory" Mar. 1990, US, vol. 32, Issue 10A, pp. 105-107, publication date Mar. 1, 1990.*

* cited by examiner

PROGRAM-CONTROLLED UNIT AND METHOD FOR IDENTIFYING AND/OR ANALYZING ERRORS IN PROGRAM-CONTROLLED UNITS

CROSS-REFERENCE TO RELATED APPLICATION

This application is a continuation of copending International Application No. PCT/DE00/02956, filed Aug. 28, 2000, which designated the United States.

BACKGROUND OF THE INVENTION

Field of the Invention

The present invention relates to a program-controlled unit having elements which can be connected to form one or more scan chains, and to a method for identifying and/or analyzing errors in program-controlled units using scan chains.

Program-controlled units, such as, in particular, microprocessors, microcontrollers, signal processors and the like, and also methods for testing these have been known for a long time in a multiplicity of embodiments.

Program-controlled units with scan chains and methods for testing program-controlled units using scan chains allow program-controlled units to be examined particularly quickly and reliably for errors.

The scan chain elements are normally selected flip-flops or all the flip-flops in the circuit to be tested. These flip-flops can be connected to form one or more scan chains when testing the circuit which is to be tested. In this context, the flip-flops are connected one behind the other in series, with the input connection of a respective flip-flop being connected to the output connection of the flip-flop which is in series upstream of it, and with the output connection of a respective flip-flop being connected to the input connection of the flip-flop which is in series downstream of it.

Such a scan chain, more precisely its elements formed by flip-flops in the example under consideration, can be initialized relatively easily. This is because a signal applied to the input connection of the first flip-flop in the scan chain, more precisely the state of the flip-flop in question which arises in response thereto, is shifted onward from flip-flop to flip-flop with the timing of a clock signal applied to the flip-flops; with each clock pulse, each flip-flop in the scan chain adopts the state of the flip-flop which is upstream of it in the scan chain.

If the $x^{th}$ flip-flop in the scan chain needs to be changed to the state A, then it is necessary to apply a signal "only" to the input connection of the first flip-flop in the scan chain, the signal allowing this flip-flop and the flip-flops connected downstream to be changed to the state A, and x clock pulses need to be applied to the scan chain (to all the flip-flops therein).

Conversely, the states of the individual flip-flops at a particular time can be read sequentially on the last flip-flop in the scan chain.

If the scan chain contains n flip-flops, then a circuit to be tested is tested on the basis of the scan method as follows: first, the circuit is changed to the scan mode of operation, as a result of which the aforementioned scan chain is formed. This scan chain is changed to a defined initial state by sequentially applying n input signals and n clock pulses. The scan chain is then broken up and the circuit to be tested is briefly started up for test purposes. In this context, at least some of the states of the flip-flops initialized at the start change, and from correct operation of the circuit to be tested it can be ascertained in which (nominal) state the flip-flops ought to be at a respective time. If the flip-flops are connected to form the scan chain again after a certain time and have clock signals applied to them, data representing the (actual) state of the flip-flops in the scan chain at the time at which the circuit's test mode ended are shifted out at the end of the scan chain (from the output connection of the last flip-flop in the scan chain) sequentially with the timing of the clock signals. If the actual state of the flip-flops in the scan chain, ascertained as described, is then compared with the known nominal state thereof, this reveals whether or not the circuit to be tested is operating correctly.

With suitable action, it is possible to identify almost any errors in program-controlled units quickly and easily in the manner described.

However, experience has shown that certain errors are not identified in a circuit test carried out as described above. This applies particularly to errors which arise only under quite specific conditions. Such errors are, by way of example, errors which arise only at a particular time after the circuit has been started up in a quite specific environment (for example errors which arise only approximately 30 seconds after the circuit has been started up at an ambient temperature of −20° C. and at a supply voltage of 5.3 V).

At present, such errors cannot be identified and analyzed, not reliably at any rate. This is frequently the case even when the circumstances under which the errors arise are known.

SUMMARY OF THE INVENTION

It is accordingly an object of the invention to provide a program-controlled unit and a method of detecting and/or analyzing errors in program-controlled units, which overcomes the above-mentioned disadvantages of the heretofore-known devices and methods of this general type and which further develops the apparatus and the method such that it is also possible for errors such as arise only under certain circumstances to be identified and/or analyzed quickly and reliably.

With the foregoing and other objects in view there is provided, in accordance with the invention, a program-controlled unit, comprising a plurality of elements to be connected to form one or more scan chains; and in which, in response to a predetermined event during program execution, the program-controlled unit can change into a state in which selected ones or all of the plurality of elements are no longer able to change a state thereof.

In accordance with an added feature of the invention, the program-controlled unit has an On-Chip Debug Support unit configured to monitor for the occurrence of the predetermined event.

In accordance with an additional feature of the invention, a clock generator supplies respective units of the program-controlled unit with clock signals, and the program-controlled unit is changed to a state in which selected ones or all of the elements that can be connected to form scan chains can no longer change their state by deactivating the clock generator.

In accordance with another feature of the invention, an interface is provided that is suitable for configuring and/or controlling parts of the program-controlled unit provided for identifying and/or analyzing errors that have occurred in the program-controlled unit from outside the program-controlled unit.

In accordance with a further feature of the invention, the interface is configured for setting the predetermined event and a reaction of the program-controlled unit to the occurrence of the predetermined event.

In accordance with again a further feature of the invention, the interface is configured to prompt for or effect connection of the elements to form a scan chain, and also to read from and write to the scan chain.

With the above and other objects in view there is also provided, in accordance with the invention, an error determination method in a program-controlled unit using scan chains, that is a method for identifying and/or analyzing an error indication. The novel method comprises reading the scan chains after a predetermined event has occurred during execution of a program by the program-controlled unit.

In accordance with again an additional feature of the invention, in response to the occurrence of the predetermined event, the program-controlled unit is changed over to a state in which selected ones or all elements that can be connected to form scan chains can no longer change their state.

In accordance with a concomitant feature of the invention, there is provided a step of reading data obtained upon reading the scan chains and comparing the data with data obtained when the scan chains in an error-free program-controlled unit are read under comparable conditions.

In other words, the invention achieves the objects as respectively outlined in the device and in the method, namely, in that, in response to a predetermined event during program execution, the program-controlled unit can change to a state in which selected ones or all of the elements which can be connected to form scan chains are no longer able to change their state (cf. device); and that the scan chains are read after a predetermined event has occurred during execution of a program by the program-controlled unit (cf. method).

If, in response to a predetermined event during program execution, the program-controlled unit changes to a state in which selected ones or all of the elements which can be connected to form scan chains are no longer able to change their state, and if the elements which can be connected to form a scan chain are then connected to form a scan chain and the scan chain is read, the data obtained in the process can be used to identify quickly and reliably even such errors in the program-controlled unit as arise only under certain circumstances.

Other features which are considered as characteristic for the invention are set forth in the appended claims.

Although the invention is illustrated and described herein as embodied in a program-controlled unit and method for identifying and/or analyzing errors in program-controlled units, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

DESCRIPTION OF THE PREFERRED EMBODIMENTS

Figure 1:
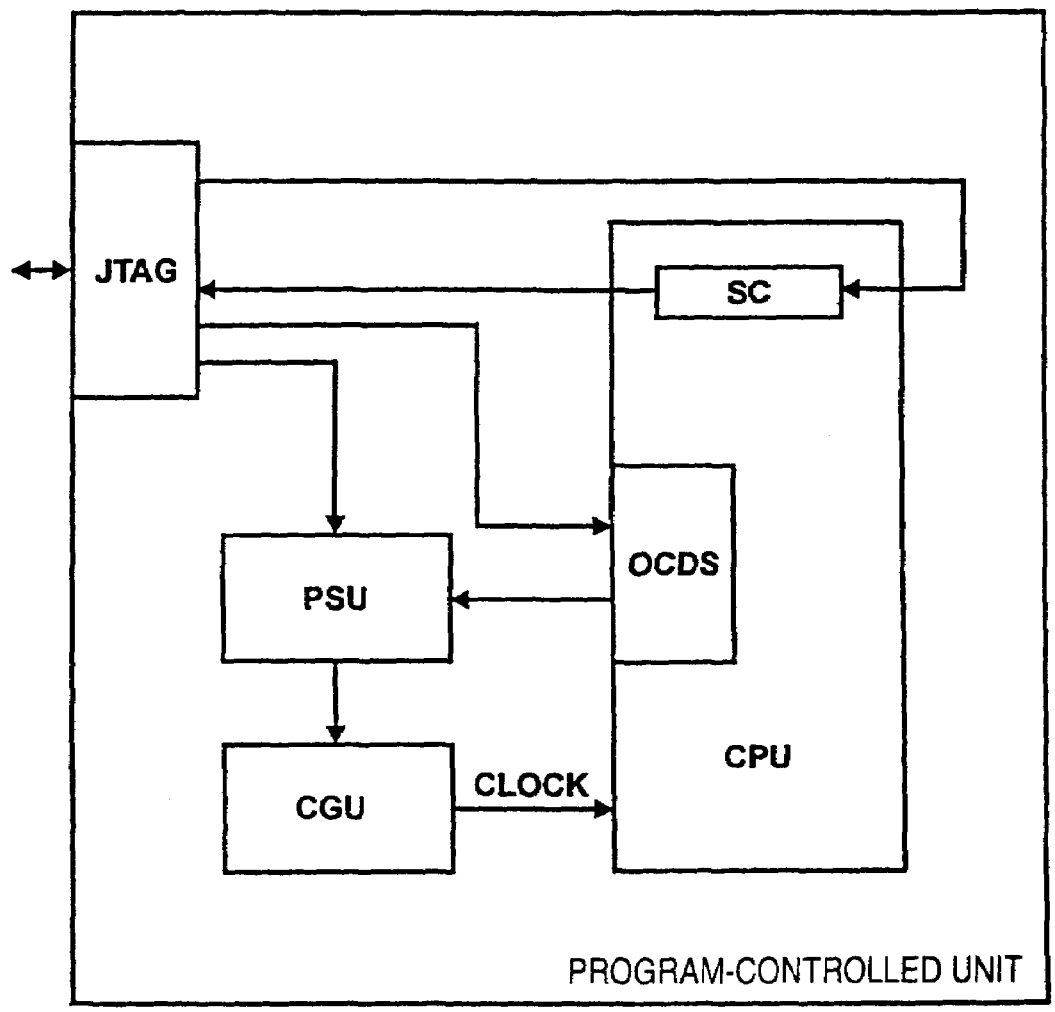
FIG. 1 is a schematic view outlining the design of a program-controlled unit.
Figure 2:
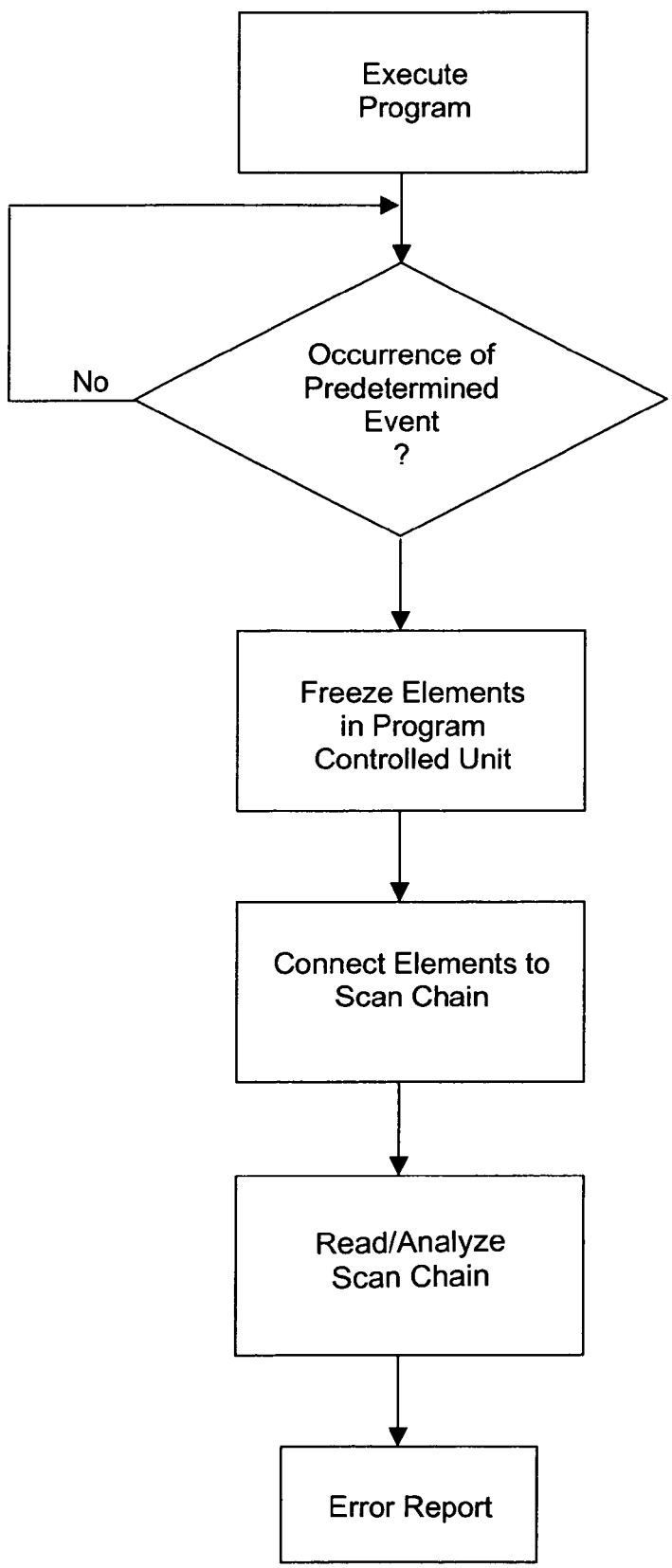
FIG. 2 is a flowchart outlining the basic steps in the method according to the invention.

The program-controlled unit described here may be a microprocessor, a microcontroller, a signal processor, or the like.

Referring now to the sole FIGURE of the drawing in detail, there is illustrated the basic design of the program-controlled unit under consideration. For the sake of completeness, it should be understood that the FIGURE shows only those parts of the program-controlled unit which are of particular interest in the present case.

The full design of program-controlled units, the function thereof and the way in which they work are known generally and require no more detailed explanation.

The program-controlled unit under consideration can be tested using one or more scan chains. It is distinguished in that, in response to a predetermined event during program execution, it can change to a state in which selected ones or all of the elements which can be connected to form scan chains are no longer able to change their state. If the elements which can be connected to form scan chains are then connected to form one or more scan chains and the latter are read, this produces the states of the scan chain elements at the time of the predetermined event. If the predetermined event represents a malfunction in the program-controlled unit or a shortly preceding or subsequent event, the data read from the scan chains can be used to ascertain and/or analyze the cause of the malfunction.

To be able to identify the discrepancies between the data read from the scan chains and the data which would be obtained in the undisturbed normal case, the said data are preferably compared with the corresponding data for a program-controlled unit which does not have the malfunction in question.

The components of the program-controlled unit which are shown in the figure comprise a central processing unit CPU, a clock generator CGU, an On-Chip Debug Support unit OCDS, a JTAG module JTAG (Joint Test Action Group) and a processor stop unit PSU; selected ones or all of the flip-flops in the program-controlled unit can be connected to form one or more scan chains SC.

When the program-controlled unit is operating normally, it, or more precisely its CPU, processes programs which are to be executed; the data representing the instructions to be executed at this time are stored in a program memory (not shown in the figure) provided inside or outside the program-controlled unit.

The CPU and the other components of the program-controlled unit operate with the timing of the clock signals CLOCK produced by the clock generator CGU.

The scan chains SC and the On-Chip Debug Support unit are used for identifying and/or analyzing hardware and/or software errors.

The design and operation of scan chains have already been described in detail and require no further explanation.

The task of the On-Chip Debug Support unit is to monitor the occurrence of particular events and to react in a predetermined manner upon the occurrence of the event in question.

Predetermined events are, by way of example, that the program-controlled unit accesses a particular memory address in the program and/or data store, and/or that the program-controlled unit reads in predetermined data from the program and/or data store or outputs them thereto, and/or that a predetermined register in the program-controlled unit adopts a predetermined content, and/or that other states which can be used as break conditions in debuggers arise. The predetermined event can also be that particular events occur simultaneously or in a particular order or that a particular number of clock cycles has elapsed after the occurrence of a particular event or a particular sequence of events.

Known On-Chip Debug Support units react to the occurrence of the predetermined event by
  signalling the occurrence of the event to an input and/or output connection of the program-controlled unit; and/or
  starting a "monitor program" which can be used to monitor the state and the response of the program-controlled unit exactly; and/or
  prompting the program-controlled unit to interrupt or stop the program execution of the program which is actually to be executed, for example by repeatedly executing NOP instructions.

In the case of the program-controlled unit considered in more detail in the present case, the OCDS unit is additionally or alternatively able to change the program-controlled unit to a state in which selected ones or all of the elements which can be connected to form scan chains can no longer change their state.

In the example under consideration, this is achieved by deactivating the clock generator CGU. The discontinuation of the clock signals produced by the clock generator CGU freezes the instantaneous state of those components of the program-controlled unit that are supplied with clock signals by the clock generator CGU.

It will be understood by those skilled in the pertinent art that freezing of the instantaneous states of the elements which can be connected to form scan chains can also be brought about in a large variety of other ways.

In the example under consideration, the clock generator CGU supplies the entire program-controlled unit with clock signals; for this reason, the state of the entire program-controlled unit is frozen in the present case. However, it should be pointed out that it is not absolutely necessary to stop the entire program-controlled unit.

The clock generator CGU is deactivated using the processor stop unit PSU; this unit deactivates the clock generator CGU at the request of the On-Chip Debug Support unit OCDS.

When the clock generator CGU has been deactivated, those components of the program-controlled unit which are normally supplied with clock signals by the clock generator CGU can no longer change their state.

However, it continues to be possible for the elements which can be connected to form scan chains to be interconnected to form one or more scan chains, and to be read.

If this is done, extensive information is obtained about the state of the program-controlled unit at the time at which the predetermined event detected by the OCDS unit occurred.

The data read from the scan chains are preferably compared with corresponding data for a correctly operating program-controlled unit. The differences ascertained in this process can be used to identify, locate and/or analyze the error in the malfunctioning program-controlled unit quickly and easily.

The On-Chip Debug Support unit OCDS, the processor stop unit PSU and the scan chains SC can be controlled externally (from outside the program-controlled unit) using the JTAG module.

The JTAG module is a known interface and requires no more detailed explanation.

The OCDS unit can be notified via the JTAG interface of, among other things,
  whether it needs to monitor the occurrence of predetermined events;
  what the predetermined event is; and/or
  how the OCDS unit needs to react to the occurrence of the predetermined event.

The processor stop unit can be notified via the JTAG interface of whether and possibly how it needs to react to requests from the OCDS unit.

The scan chains SC can be put together, broken up, read and written to via the JTAG interface.

Hence, all operations which need to be performed in the program-controlled unit for the purposes of identifying and/or analyzing errors in the program-controlled unit in the manner described above can be prompted from outside the program-controlled unit using a standard interface. If the system containing the program-controlled unit is extended accordingly, it is possible to perform error detection and error analysis without having to remove the program-controlled unit from the system containing it.—This is found to be of great advantage, because it allows maximum ease and reliability of error detection and error analysis.

The described program-controlled unit and the described method make it possible to identify and analyze errors in program-controlled units quickly and reliably even if they arise only under certain circumstances.

We claim:

1. A program-controlled unit, comprising:
  a plurality of elements configured to selectively change a state thereof during program execution and to be connected to form one or more scan chains;
  wherein the program-controlled unit, in response to a predetermined event detected during program execution, is configured to change into a state in which selected ones or all of said plurality of elements are no longer able to change the state thereof, to subsequently connect the selected ones or all of said plurality of elements to one of more scan chains, and to read a content of the scan chains; and
  an interface suitable for at least one of configuring and controlling parts of the program-controlled unit provided for identifying and/or analyzing errors that have occurred in the program-controlled unit from outside the program-controlled unit, said interface being configured to effect a connection of said elements to form a scan chain, and also to read from and write to the scan chain.

2. The program-controlled unit according to claim 1, which comprises an On-Chip Debug Support unit configured to monitor for an occurrence of the predetermined event.

3. The program-controlled unit according to claim 1, which comprises a clock generator for supplying respective units of the program-controlled unit with clock signals, and wherein the program-controlled unit is changed to a state in which selected ones or all of said elements that can be connected to form scan chains can no longer change their state by deactivating said clock generator.

4. The program-controlled unit according to claim 1, wherein said interface is configured for setting the predetermined event and a reaction of the program-controlled unit to the occurrence of the predetermined event.

5. The program-controlled unit according to claim 1, wherein said interface is configured to prompt for connection of said elements to form a scan chain, and also to read from and write to the scan chain.

6. An error determination method in a program-controlled unit using scan chains with a plurality of elements, which comprises executing the following method steps:
after a predetermined event has occurred during execution of a program by the program-controlled unit, in response to the predetermined event, placing the program-controlled unit into a state in which selected ones or all of the elements are no longer able to change the state thereof,
using an interface to connect the elements that are no longer able to change the state thereof to form the scan chains,
using the interface to read the scan chains, and
subsequently identifying and analyzing an error in the program-controlled unit from the state of the scan chains read through the interface.

7. The method according to claim 6, which further comprises, in response to an occurrence of the predetermined event, changing the program-controlled unit over to a state in which selected ones or all elements that can be connected to form scan chains can no longer change their state.

8. The method according to claim 6, which comprises reading data obtained upon reading the scan chains and comparing the data with data obtained when the scan chains in an error-free program-controlled unit are read under comparable conditions.

9. A program-controlled unit, comprising:
a plurality of elements configured to selectively change a state thereof during program execution and to be connected to form one or more scan chains;
wherein the program-controlled unit, in response to a predetermined event detected during program execution, is configured to change into a state in which selected ones or all of said plurality of elements are no longer able to change the state thereof, to subsequently connect the selected ones or all of said plurality of elements to one or more scan chains, and to output a content of the scan chains; and
an interface suitable for controlling parts of the program-controlled unit provided for identifying and/or analyzing errors that have occurred in the program-controlled unit from outside the program-controlled unit, and for setting the predetermined event and a reaction of the program-controlled unit to the occurrence of the predetermined event.

10. The program-controlled unit according to claim 9, which comprises an On-Chip Debug Support unit configured to monitor for an occurrence of the predetermined event.

11. The program-controlled unit according to claim 9, which comprises a clock generator for supplying respective units of the program-controlled unit with clock signals, and wherein the program-controlled unit is changed to a state in which selected ones or all of said elements that can be connected to form scan chains can no longer change their state by deactivating said clock generator.

12. A program-controlled unit, comprising:
a plurality of elements configured to selectively change a state thereof during program execution and to be connected to form one or more scan chains;
wherein the program-controlled unit, in response to a predetermined event detected during program execution, is configured to change into a state in which selected ones or all of said plurality of elements are no longer able to change the state thereof, to subsequently connect the selected ones or all of said plurality of elements to one or more scan chains, and to output a content of the scan chains; and
an interface suitable for at least one of configuring and controlling parts of the program-controlled unit provided for identifying and/or analyzing errors that have occurred in the program-controlled unit from outside the program-controlled unit, said interface being configured to prompt for or to effect a connection of said elements to form a scan chain, and also to read from and write to the scan chain.

13. The program-controlled unit according to claim 12, which comprises an On-Chip Debug Support unit configured to monitor for an occurrence of the predetermined event.

14. The program-controlled unit according to claim 12, which comprises a clock generator for supplying respective units of the program-controlled unit with clock signals, and wherein the program-controlled unit is changed to a state in which selected ones or all of said elements that can be connected to form scan chains can no longer change their state by deactivating said clock generator.

* * * * *